United States Statutory Invention Registration [19]

Koo

[11] Reg. Number: H94

[45] Published: Jul. 1, 1986

[54] HIGH STABILITY FIBER OPTIC MAGNETIC FIELD SENSOR WITH ENHANCED LINEAR RANGE USING MAGNETIC FEEDBACK NULLING

[75] Inventor: Kee P. Koo, Alexandria, Va.

[73] Assignee: United States of America, Washington, D.C.

[21] Appl. No.: 795,949

[22] Filed: Nov. 7, 1985

[51] Int. Cl.[4] ..... H01J 5/16

[52] U.S. Cl. ..... 250/227; 250/231 R

[56] References Cited

U.S. PATENT DOCUMENTS 4,433,291 2/1984 Yariv et al. ..... 324/244

*Primary Examiner*—S. C. Buczinski
*Assistant Examiner*—Linda J. Wallace
*Attorney, Agent, or Firm*—Robert F. Beers; William T. Ellis

[57] ABSTRACT

A fiber optic interferometer-type magnetic field sensor which uses an automatic feedback system to limit the range of the magnetic field experienced by the sensor element. A high frequency bias field is mixed with the external magnetic field to be measured and the resulting interferometer output signal is converted to an electric output signal. The electric output signal is mixed with a reference signal having the same frequency as the bias signal to form a baseband negative feedback signal which is converted to a magnetic field and mixed with the bias and external fields to provide automatic feedback.

11 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH STABILITY FIBER OPTIC MAGNETIC FIELD SENSOR WITH ENHANCED LINEAR RANGE USING MAGNETIC FEEDBACK NULLING

BACKGROUND OF THE INVENTION

The invention is directed to fiber optic magnetic field sensor systems, and more particularly to methods and apparatus for stabilizing fiber optic magnetic field sensor systems.

Two-arm Mach-Zehnder fiber optic interferometers may be used for the sensing of magnetic fields by bonding a magnetostrictive material onto one of the fiber interferometer arms. The interferometer arm so bonded to the magnetostrictive material is used as a sensor fiber and the other interferometer arm is used as a reference fiber. When exposed to a magnetic field, the magnetostrictive material will stretch the sensor fiber while the reference fiber remains unaffected. As a result, a magnetically induced differential path length change or phase shift is introduced at the output of the interferometer.

The performance of this type of fiber optic magnetic field sensor depends on the characteristics of the magnetostrictive properties of the magnetic material. The desired material characteristics that are of interest to the magnetic field sensor applications are:

(1) High magnetostrictive constant which relates to the high sensor sensitivity.

(2) Perfect or high degree of quadratic response of magnetostriction with respect to magnetic field, which relates to the high degree of linearity and the high sensitivity of the fiber sensor response.

(3) Large maximum magnetic field beyond which the magnetostrictive response deviates from quadratic to some unacceptable level. The useable linear dynamic range of the magnetic material will be limited by this maximum magnetic field.

(4) Minimal magnetic hysteresis to avoid ambiguity in determining the actual magnetic field without knowing its magnetic history.

(5) Low magnetic noise from the sensor material which would enhance the low magnetic field measurement capability. One source of magnetostrictive noise is the Barkhausen noise which occurs at some discrete magnetic field levels corresponding to abrupt magnetic structural changes.

(6) Minimal magnetic instabilities in terms of overall sensitivity due to surface oxidation and magnetic structural changes arising from repeated magnetic cycling over a moderate magnetic field range.

It is difficult, if not impossible, for a material to have all the desired features of high sensitivity, large linear dynamic range, uniform frequency response and, at the same time be magnetically stable over a large dynamic range of applied magnetic fields. The magnetic materials currently being used in the fiber optic magnetic field sensor are metallic glasses which must be thermally annealed near their Curie temperature in the presence of a strong magnetic field (>500 Oe). These materials are chosen because of their magnetic softness, implying potentially high sensitivity for sensor applications. To date, it has been found that these materials have a working range of linear response below two Orsteds of magnetic field. In addition, the magnetic field annealing process is crucial in obtaining a smooth linear response in the 0–2 Orsted magnetic field range. There is also an indication that an initally smooth linear response will lose its smoothness through repeated cycling over a moderately large magnetic field.

OBJECTS OF THE INVENTION

Accordingly, it is an object of the invention to increase the stability of fiber optic magnetic field sensor systems for static or low frequency magnetic fields.

Another object of the invention is to increase the effective signal-to-noise ratio of fiber optic magnetic field sensor systems for static or low frequency magnetic fields.

Yet another object of the invention is to eliminate magnetic hysteresis effects in the response of fiber optic magnetic field sensor systems for static or low frequency magnetic fields.

Still another object of the invention is to increase the dynamic range of fiber optic magnetic field sensor systems for static or low frequency magnetic fields.

A further object of the invention is to increase the linearity of fiber optic magnetic field sensor systems for static or low frequency magnetic fields.

A still further object of the invention is to increase the sensitivity of fiber optic magnetic field sensor systems for static or low frequency magnetic fields.

SUMMARY OF THE INVENTION

These and other objects of the invention are achieved by mixing a high frequency magnetic bias field with an external low frequency or steady state magnetic field to be measured, sensing their resultant sum magnetic field with an interferometer-type magnetostrictive sensor, converting the sensor output to an electrical output signal which is mixed with a reference signal of the same frequency as the bias signal to form a baseband negative feedback signal, and converting the feedback signal to a magnetic field which is mixed with the bias and external measured fields to improve stability, linearity, dynamic range and sensitivity of the magnetic sensor.

Other objects, features and advantages of the invention will be apparent to those skilled in the art in the description of the preferred embodiment as described below and also recited in the appended claims.

DESCRIPTION OF THE PREFERRED EMBODIMENT

Figure 1:
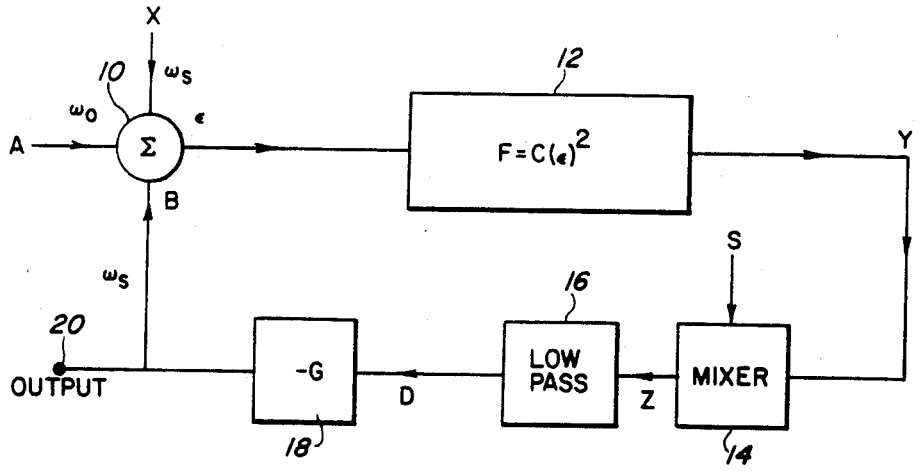
FIG. 1 shows the signal flow diagram for one embodiment according to the invention.

Referring to the drawings, wherein like reference characters designate like or corresponding parts throughout the views, FIG. 1 shows the system control diagram for the preferred embodiment of the invention. An external magnetic field signal X having a characteristic fundamental frequency $\omega_s$ which is to be measured is coupled to a magnetic sensor input 10. A magnetic bias signal A is also coupled to magnetic sensor input 10. Magnetic bias signal A has a characteristic frequency $\omega_o$ sufficiently greater than $\omega_s$ such that signals X and A may be separated by frequency filtration methods well known in the art. Finally, a feedback signal B, whose derivation will be described hereinafter, is coupled to magnetic sensor input 10. Magnetic sensor input 10 produces an output error signal $\epsilon$ comprising the summation of signals A, B and X, thereby establishing the relationship $$\epsilon = A + B + X \tag{1}$$

Error signal $\epsilon$ is coupled to a conventional optical interferometer-type magnetic sensor system 12. Interferometer system 12 processes error signal $\epsilon$ to generate an interferometer output signal Y. Signal Y is proportional to the square of error signal $\epsilon$, establishing a relationship $$Y = C\epsilon^2 \tag{2}$$

wherein C is a constant.

Combining equations (1) and (2), the relationship between signals A, B, X and Y may be shown as $$Y = CA^2 + CB^2 + CX^2 + 2ACX + 2ACB + 2CXB \tag{3}$$

Signal Y is fed into a conventional mixer 14. A reference signal S at a reference frequency of $\omega_o$ is also fed into said mixer 14. Reference signal S is mixed with signal Y in mixer 14 to produce a mixer output signal Z. Mixer signal Z has only two terms at baseband corresponding to the amplitudes of the fourth and fifth terms of interferometer signal Y as expressed in equation (3), namely, $2|A|CX$ and $2|A|CB$, wherein $|A|$ is the amplitude of signal A.

Mixer signal Z is fed through a conventional low pass filter 16 to produce a filter output signal D. Filter 16 passes only said baseband terms of mixer signal Z, thereby establishing the relationship $$D = 2C|A|(X + B) \tag{4}$$

Filter output signal D is fed through a well known inverting amplifier 18 to produce said feedback signal B. A conventional lock-in ampliifer may be substituted for mixer 14 and low pass filter 16, as will be apparent to those skilled in the art. Inverting amplifier 18 inverts filter output signal D and amplifies it by an amplification factor G, thereby establishing the relationship $$B = -2GC|A|(X + B) \tag{5}$$

Feedback signal B as expressed in equation (5) may be rearranged to describe signal B in terms of G, C, $|A|$ and X so that $$B = \frac{-2GC|A|}{1 + 2GC|A|} X \tag{6}$$

It may be seen from equation (6) that for large values of amplification factor G (i.e., $2GC|A| >> 1$), signal B approximates the magnitude of magnetic field signal X. Feedback signal B is fed to an output terminal 20 and sensor input 10. Because signal B approximates the magnitude of the magnetic field signal X when amplification factor G is high, the magnitude of the magnetic field signal X may be measured directly at output terminal 20.

Substituting the relationship shown in equation 6 for signal B in equation (1), error signal $\epsilon$ may be shown as $$= A + \frac{1}{1 + 2GC|A|} X \tag{7}$$

For large values of amplification factor G (i.e., $2GC|A| >> 1$), it may be seen from equation (7) that error signal approximates the value of magnetic bias signal A, indicating that the actual magnetic field that said magnetic sensor system 12 experiences is approximately equal to the small value of bias signal A.

Substituting the relationship shown in equation (7) for signal Y in equation (2), interferometer output signal Y may be shown as $$Y = CA^2 + \frac{1}{1 + 4G^2C^2|A|^2 + 4GC|A|} CX^2 + \frac{2CA}{1 + 2GC|A|} X \tag{8}$$

For large values of amplification factor G (i.e., $2GC|A| >> 1$), it may be seen that signal Y may be approximated by the relationship $$Y = CA^2 + \frac{1}{4G^2C|A|^2} X^2 + \frac{A}{G|A|} X \tag{9}$$

indicating that signal Y may be directly connected to a spectrum analyzer to serve as an indicator of frequency $\omega_S$ of magnetic field signal X.

Figure 2:
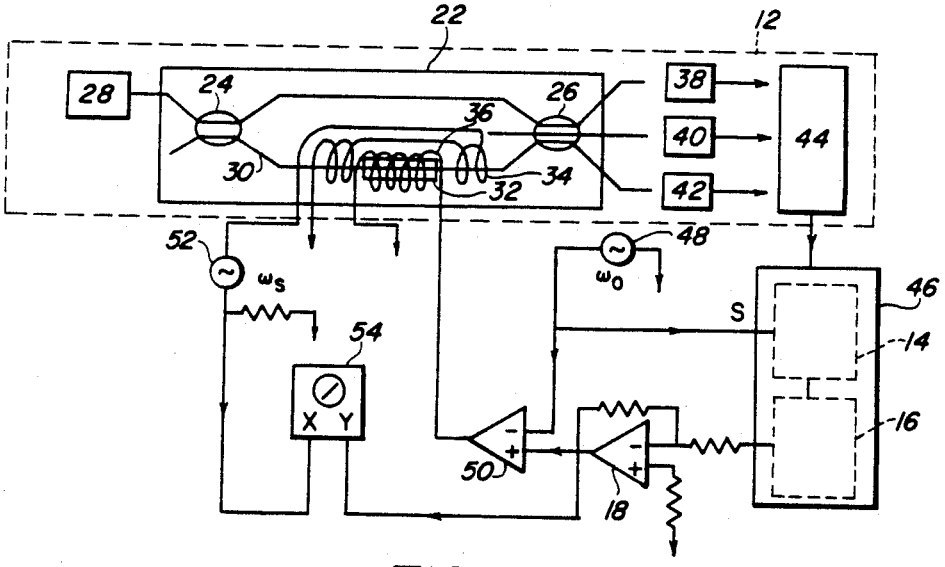
FIG. 2 shows a block diagram for a sensor system according to the embodiment of the invention.

A system incorporating the embodiment described above is shown in FIG. 2. A standard conventional Mach-Zehnder fiber optic interferometer 22 including a splitter 24 comprising a conventional (2×2) coupler and a combiner 26 comprising a conventional (3×3) coupler is fed by a conventional laser diode 28. An arm 30 of interferometer 22 includes a magnetic sensing element 32 comprising a piece of magnetostrictive material bonded to arm 30.

A bias coil 34 comprising a conventional solenoid is mounted in proximity to sensing element 32. A feedback coil 36 comprising a conventional solenoid is also mounted in proximity to sensing element 32. Each of the three outputs from combiner 26 is fed to a separate detector 38, 40, 42 each comprising a conventional electro-optical transducer to convert the optical combiner outputs to electrical outputs. The outputs from detectors 38, 40, 42 are fed into a conventional passive signal stabilization processor 44. The output of processor 44 is fed into the input of a conventional lock-in amplifier 46 which is locked to a reference signal of frequency $\omega_o$ generated by a conventional reference signal generator 48. The output of lock-in amplifier 46 is fed into inverting amplifier 18 having an amplification factor G. The output of inverting amplifier 18 is fed into the non-inverting input of a well known differential amplifier 50. The output of reference signal generator 48 is fed into the inverting input of differential amplifier 50. The output of differential amplifier 50 is fed into feedback coil 36.

A conventional test signal generator 52 is connected to bias coil 34 to simulate external magnetic field signal X of frequency $\omega_S$. For monitoring purposes, the output of test signal generator 52 is connected to the horizontal input of a conventional oscilloscope 54, and the output of inverting amplifier 18 is connected to the vertical input of oscilloscope 54.

When magnetic field test signal X has a sawtooth-type characteristic waveform with a fundamental frequency $\omega_s$ of 0.02 Hz and the bias and reference signals A and S respectively have a frequency $\omega_o$ of 820 Hz, significant improvement in sensor linearity and freedom from hysteresis effects may be observed on oscilloscope 54 as the gain of amplifier 18 is increased from an amplification factor of zero to 200.

A wide variety of frequencies may be substituted for signal X, including a direct current signal, and the bias signal A may likewise be varied over a wide range of frequencies, as may be recognized by those skilled in the art. As explained above, the bias frequency selected need only be sufficiently removed from the frequency of the magnetic field signal to be measured so that well known frequency discriminative circuitry may be employed to seperate them. Likewise, feedback gain is a matter of choice, which may be adjusted to achieve any desired degree of linearity.

There has therefore been described a fiber optic interferometer-type magnetic field sensor system which uses high frequency bias and low frequency magnetic field signals to minimize the net low frequency magnetic field experienced by the sensor fiber. As a result, the magnetic stability and linearity of the magnetostrictive material used in the sensor need only have magnetic stability and linearity over a small range of magnetic field, thereby improving overall sensitivity and extending the linear dynamic range.

It will be understood that various changes in the details, materials and arrangements of parts which have been herein described and illustrated in order to explain the nature of the invention may be made by those skilled in the art within the principle and scope of the invention as expressed in the appended claims.

What is claimed and desired to be secured by Letters Patent of the United States is:

1. An apparatus for increasing sensing linearity and dynamic range of a fiber optic interferometer-type magnetic field sensor, comprising:

a magnetostrictive square law sensing element;

means for generating a reference magnetic bias signal having a reference frequency greater than a magnetic measured field signal;

means for sensing said reference signal and said measured signal with said sensing element to form an interferometer output signal;

means for detecting said interferometer output signal to form an electrical detection signal;

means for mixing said detection signal with a mixer signal having said reference frequency to form a square law mixer output signal;

means for low pass filtering said mixer output signal below said reference frequency to form a baseband output signal of frequency less than said reference frequency;

means for amplifying said baseband output signal to form an electrical feedback signal;

means for converting said electrical feedback signal to a magnetic signal of opposed polarity to said measured signal; and means for sensing said feedback signal with said sensing element to form a linearized interferometer output signal.

2. The fiber optic magnetic field sensor recited in claim 1, wherein said means for generating a reference magnetic bias signal comprises a magnetic field bias coil energized by an electric reference signal having said reference frequency.

3. The fiber optic magnetic field sensor recited in claim 2, wherein said means for sensing said reference signal and said measured signal with said sensing element comprises a mounting for said bias coil in proximity to said sensing element.

4. The fiber optic magnetic field sensor recited in claim 3, wherein said means for converting said electrical feedback signal comprises a magnetic field feedback coil.

5. The fiber optic magnetic field sensor recited in claim 4, wherein said means for sensing said feedback signal comprises a mounting for said feedback coil in proximately to said sensing element.

6. The fiber optic magnetic field sensor recited in claim 5, wherein said means for detecting said interferometer output signal comprises an electro-optical detector.

7. The fiber optic magnetic field sensor recited in claim 6, wherein said means for mixing said detection signal with a mixer signal comprises a square law signal mixer.

8. The fiber optic magnetic field sensor recited in claim 7, wherein said means for low pass filtering comprises a low pass signal filter having a cutoff frequency less than said reference frequency.

9. The fiber optic magnetic field sensor recited in claim 8, wherein said means for amplifying said baseband output signal comprises a linear signal amplifier.

10. A method of increasing sensing linearity and dynamic range of a fiber optic interferometer-type magnetic field sensor system including a magnetostrictive square law sensing element, comprising the steps of:

generating a reference magnetic bias signal having a reference frequency greater than a magnetic measured field signal;

sensing said reference signal and said measured signal with said sensing element to form an interferometer output signal;

detecting said interometer output signal with an electro-optical detector to form an electrical detection signal;

mixing said detection signal with a mixer signal having said reference frequency to form a square law mixer output signal;

low pass filtering said mixer output signal below said reference frequency to form a baseband output signal of frequency less than said reference frequency;

amplifying said baseband output signal to form an electrical feedback signal;

converting said electrical feedback signal to a magnetic feedback signal of opposed polarity to said measured signal; and sensing said feedback signal with said sensing element to form a linearized interferometer output signal.

11. An apparatus for increasing sensing linearity and dynamic range of a fiber optic interferometer-type magnetic field sensor, comprising:

a magnetostrictive square law sensing element;

a magnetic sensing field generating an interferometer output signal comprising a bias field, a feedback field and a measured field, said bias field comprising an alternating magnetic field having a reference frequency greater than said measured fields;

an electro-optical detector converting said interferometer output signal to an electric detector output signal;

a square law mixer mixing said detector signal with a mixing signal having said reference frequency to form a mixer output signal;

a low pass filter having a cutoff frequency less than said reference frequency filtering said mixer output signal to form a baseband output signal;

a linear amplifier amplifying said baseband output signal to form an electrical feedback signal; and an electro-magnetic coil converting said electrical feedback signal to said magnetic feedback field with opposed polarity to said magnetic measured field.

* * * * *